(12) United States Patent
Izumi et al.

(10) Patent No.: US 8,502,441 B2
(45) Date of Patent: Aug. 6, 2013

(54) LIGHT EMITTING DEVICE HAVING A COATED NANO-CRYSTALLINE PHOSPHOR AND METHOD FOR PRODUCING THE SAME

(75) Inventors: Makoto Izumi, Osaka (JP); Kazunori Annen, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 13/536,629

(22) Filed: Jun. 28, 2012

(65) Prior Publication Data

US 2013/0002124 A1     Jan. 3, 2013

(30) Foreign Application Priority Data

Jun. 28, 2011   (JP) ................................. 2011-142411
Apr. 4, 2012    (JP) ................................. 2012-085086

(51) Int. Cl.
*H01J 1/63*    (2006.01)
*B23P 17/04*   (2006.01)
*B82Y 20/00*   (2011.01)

(52) U.S. Cl.
USPC ............................ 313/498; 313/512; 445/24

(58) Field of Classification Search
CPC ............... H01J 1/63; B23P 17/04; B82Y 20/00
USPC .......... 313/498, 499; 428/328, 917; 257/89, 257/99
See application file for complete search history.

(56) References Cited

U.S. PATENT DOCUMENTS

| | | | |
|---|---|---|---|
| 7,719,022 B2 * | 5/2010 | Maeda ............................ | 257/98 |
| 7,892,452 B2 * | 2/2011 | Ryowa et al. ........... | 252/301.4 R |
| 8,153,022 B2 * | 4/2012 | Ryowa ...................... | 252/301.33 |
| 2006/0083694 A1 * | 4/2006 | Kodas et al. ..................... | 424/46 |
| 2006/0226759 A1 | 10/2006 | Masuda et al. | |
| 2007/0290384 A1 * | 12/2007 | Kodas et al. ....................... | 264/5 |
| 2008/0173845 A1 * | 7/2008 | Ryowa et al. ............ | 252/301.36 |

FOREIGN PATENT DOCUMENTS

| | | |
|---|---|---|
| JP | 2004-71357 | 3/2004 |
| JP | 2007-49114 | 2/2007 |

OTHER PUBLICATIONS

Murray et al. (1993). "Synthesis and Characterization of Nearly Monodisperse CdE (E = S, Se, Te) Semiconductor Nanocrystallites," *Journal of the American Chemical Society* 115:8706-8715.

* cited by examiner

*Primary Examiner* — Tracie Y Green
(74) *Attorney, Agent, or Firm* — Morrison & Foerster LLP

(57) ABSTRACT

A light emitting device includes a light emitting element that emits primary light and a wavelength conversion unit that absorbs part of the primary light and emits secondary light. In the light emitting device, the wavelength conversion unit includes a plurality of types of phosphors that emit secondary light having wavelengths different from each other, and at least one of the phosphors is a covered phosphor covered with a surface film that reflects secondary light emitted from a phosphor other than the covered phosphor.

14 Claims, 9 Drawing Sheets

80

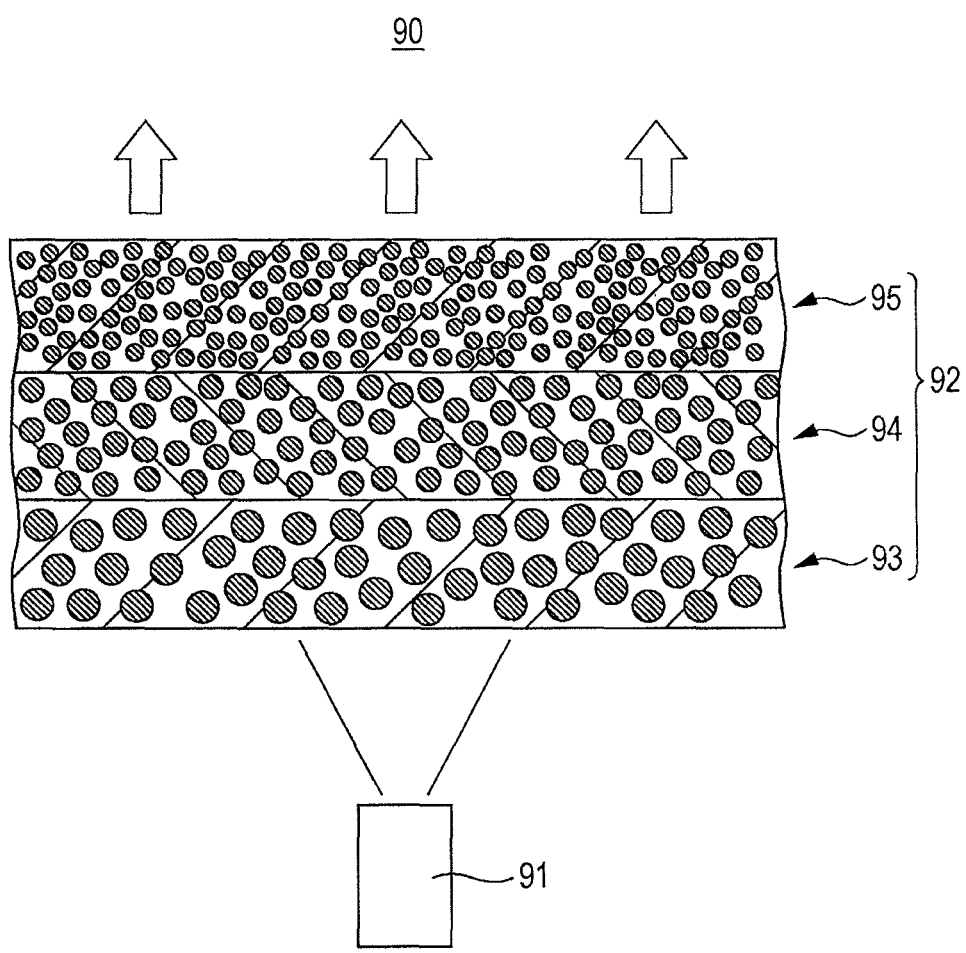

US 8,502,441 B2

LIGHT EMITTING DEVICE HAVING A COATED NANO-CRYSTALLINE PHOSPHOR AND METHOD FOR PRODUCING THE SAME

This application is based on Japanese Patent Application No. 2011-142411 filed on Jun. 28, 2011 and Japanese Patent Application No. 2012-085086 filed on Apr. 4, 2012 the contents of which is hereby incorporated by reference.

BACKGROUND OF THE INVENTION

1. Field of the Invention

The present invention relates to a light emitting device including a semiconductor light emitting element that emits primary light and a wavelength conversion unit including a phosphor that absorbs the primary light and emits secondary light.

2. Description of the Related Art

In recent years, illuminators that use light emitting diode (LED) elements have been receiving attention. Such light emitting diode elements have excellent characteristics such as power saving, a long product lifetime, and low impact on the environment. In particular, various light emitting devices including a light emitting device that emits white light have been developed by combining a phosphor with a light emitting diode element that emits blue light or ultraviolet light. A phosphor that emits light having a desired wavelength is excited by light emitted from the light emitting diode element and emits such light. It is hoped that such a light emitting device will replace incandescent lamps or fluorescent lamps as an illuminator. Thus, such a light emitting device has been actively developed.

Japanese Unexamined Patent Application Publication No. 2007-49114 (Patent Document 1) discloses an example of a light emitting device that uses such a light emitting diode. FIG. 8 is a schematic view of the light emitting device disclosed in Patent Document 1. In Patent Document 1, a light emitting device 80 includes a light emitting element 81 that emits primary light and a wavelength conversion unit 82 that absorbs part of the primary light and emits secondary light having a wavelength longer than or equal to that of the primary light. The wavelength conversion unit 82 includes a plurality of types of phosphors 83, 84, and 85 having light absorption bands different from each other. At least one of the plurality of types of phosphors has an absorption band in which secondary light emitted from at least one of the other phosphors can be absorbed. In such a structure, emission color is easily set and a light emitting device with high luminance can be realized.

In light emitting devices that use light emitting diode elements, a rare-earth activated phosphor has been mainly used so far. In recent years, a semiconductor nanocrystal phosphor (hereinafter referred to as "nanocrystal phosphor") has been receiving attention as a fluorescent material that allows production of a light emitting device having good color rendering properties and high emission efficiency. A direct band gap semiconductor emits fluorescence having a wavelength intrinsic to the semiconductor. As a result of decreasing the grain size of the semiconductor to a size approximately equivalent to a Bohr radius, the kinetic energy of electrons is increased and the energy level of the electrons becomes discrete in both a valence band and a conduction band. Consequently, the emission wavelength decreases as the grain size decreases. Therefore, a semiconductor nanocrystal phosphor is different from conventional phosphors in that the emission wavelength of the semiconductor nanocrystal phosphor can be freely controlled by changing its grain size. Furthermore, by combining some types of nanocrystal phosphors with each other, light having various wavelengths can be emitted. The following semiconductors have been mainly studied and reported as materials of a nanocrystal phosphor. An example of a group II-VI compound semiconductor is CdSe (e.g., refer to C. B. Murray, D. J. Norris, and M. G. Bawendi, Synthesis and Characterization of Nearly Monodisperse CdE (E=S, Se, Te) Semiconductor Nanocrystallites, "Journal of the American Chemical Society", vol. 115, 1993, pp. 8706 to 8715). An example of a group III-V compound semiconductor is InP.

FIG. 9 is a schematic view of an illuminator disclosed in Japanese Unexamined Patent Application Publication No. 2004-71357 (Patent Document 2). In an illuminator 90 disclosed in Patent Document 2, three phosphors containing nanocrystals having different grain sizes are stacked on top of each other in descending order of grain size in a direction of an optical path so as to constitute a wavelength conversion unit 92. Specifically, a red phosphor 93 containing an InN-based nanocrystal that has the largest grain size and emits red light, a green phosphor 94 containing an InN-based nanocrystal that has a grain size smaller than that of the red phosphor 93 and emits green light, and a blue phosphor 95 containing an InN-based nanocrystal that has a grain size smaller than that of the green phosphor 94 and emits blue light are stacked on top of each other in that order from a light source 91 so as to constitute the wavelength conversion unit 92.

However, in the case where the light emitting device 80 disclosed in Patent Document 1 is actually operated to emit light, when light emitted from the light emitting element 81 passes through each of multiple layers composed of the phosphors, part of the light is absorbed by a layer located above. Thus, the efficiency of extracting red light from the lowermost layer composed of the phosphor 83 is particularly decreased. Furthermore, the emission efficiency of a phosphor is not necessarily 100%. Therefore, when two-step optical conversion (e.g., the phosphor 83 absorbs light emitted from the light emitting element 81 and generates fluorescence, and then the phosphor 84 absorbs the fluorescence and emits secondary light in the form of fluorescence) is performed, energy loss occurs. As a result, the intensity of light emitted from the lowermost layer composed of the phosphor 83 is particularly decreased. This disturbs the balance of emission intensities of the light colors and it becomes difficult to achieve ideal color reproducibility and luminosity. Note that the term "emission efficiency" mentioned herein is defined as a ratio of the number of photons emitted as photoluminescence relative to the number of photons absorbed.

A nanocrystal phosphor absorbs light having any wavelength shorter than its emission wavelength. Therefore, when nanocrystal phosphors having different grain sizes are stacked on top of each other in the illuminator 90 disclosed in Patent Document 2, a nanocrystal phosphor that emits secondary light having a longer wavelength needs to be disposed in a layer closer to the light emitting element 91 in the optical path to prevent secondary light having a shorter wavelength from being absorbed by the nanocrystal phosphor that emits secondary light having a longer wavelength.

In either case, a step of sealing phosphor-containing resins in a chip in a desired order is added to the production process, which decreases the production efficiency.

SUMMARY OF THE INVENTION

It is an object of the present invention to provide a high luminance, high color reproducibility light emitting device whose emission color is easily adjusted and set and production process is simplified and which reduces the effect of light scattering.

According to an aspect of the present invention, a light emitting device includes a light emitting element that emits primary light and a wavelength conversion unit that absorbs part of the primary light and emits secondary light. The wavelength conversion unit includes a plurality of types of phosphors that emit secondary light having wavelengths different from each other, and at least one of the phosphors is a covered phosphor covered with a surface film that reflects secondary light emitted from a phosphor other than the covered phosphor.

The surface film may be a film formed through alternate stacking of layers of two compounds having different dielectric constants. At least one of the compounds may be aluminum oxide or silicon oxide.

The surface film is preferably a film formed by repeatedly performing the alternate stacking 5 times or more and 25 times or less. The surface film is more preferably a film formed by repeatedly performing the alternate stacking 10 times or more and 20 times or less.

The covered phosphor may emit secondary light having a wavelength longer than that of secondary light emitted from the phosphor other than the covered phosphor. At least one of the plurality of types of phosphors may be a nanocrystal phosphor.

The nanocrystal phosphor may be composed of a group III-V compound semiconductor or a group II-VI compound semiconductor. The nanocrystal phosphor may contain at least one of InP and CdSe. At least one of the plurality of types of phosphors may be a rare-earth activated phosphor.

The rare-earth activated phosphor may contain cerium or europium as an activator. The rare-earth activated phosphor may be a nitride phosphor. The nitride phosphor may be a SiAlON phosphor.

According to another aspect of the present invention, a method for producing a light emitting device including a light emitting element that emits primary light and a wavelength conversion unit that absorbs part of the primary light and emits secondary light includes a step of forming the wavelength conversion unit using a plurality of types of phosphors that emit secondary light having wavelengths different from each other. At least one of the phosphors is a covered phosphor covered with a surface film that reflects secondary light emitted from a phosphor other than the covered phosphor.

BRIEF DESCRIPTION OF THE DRAWINGS

FIG. 9 is a schematic view of a typical light emitting device.

DESCRIPTION OF THE PREFERRED EMBODIMENT

An embodiment of the present invention will now be described with reference to the attached drawings. In this specification, the term "nanocrystal" means a crystal whose size is decreased to a size approximately equivalent to an exciton Bohr radius so that excitons are confined and a band gap is increased due to a quantum size effect.

Figure 1:
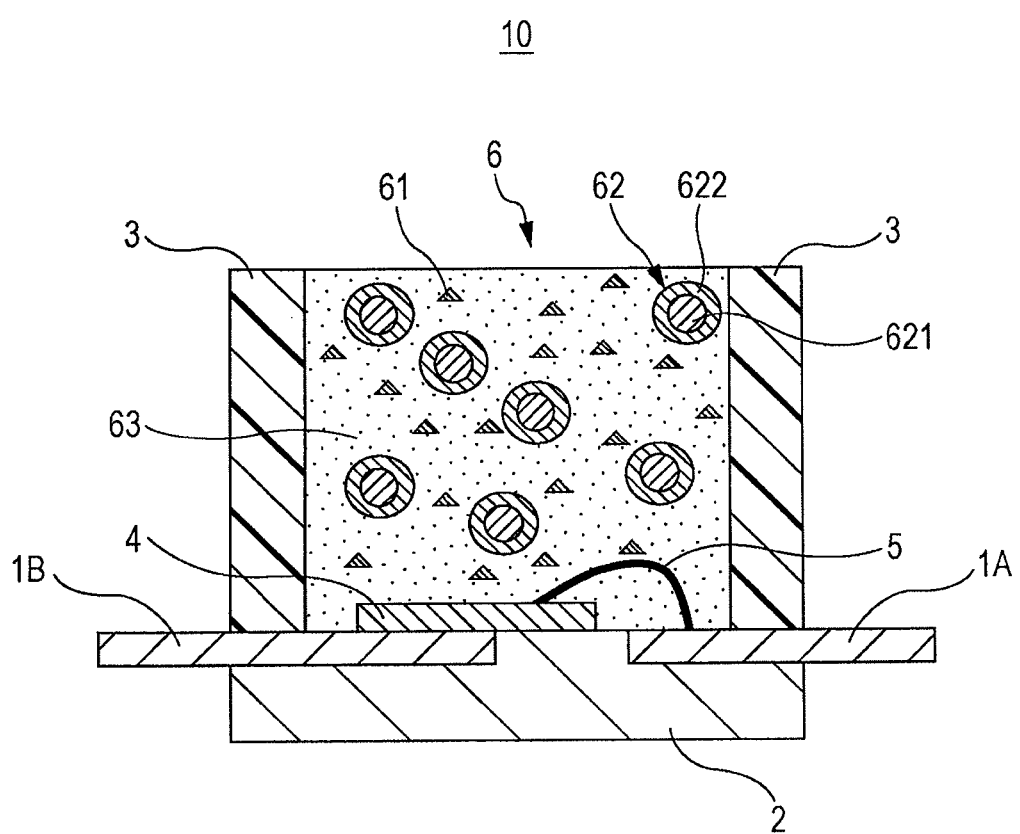
FIG. 1 is a sectional view of a light emitting device according to an embodiment of the present invention.

FIG. 1 is a sectional view of a light emitting device 10 according to an embodiment. The light emitting device 10 includes a first electrode 1A and a second electrode 1B, a substrate 2 on which the first and second electrodes 1A and 1B are formed, a package 3 disposed on the first and second electrodes 1A and 1B, a light emitting element 4 formed on the second electrode 1B, a wire 5 that connects the light emitting element 4 to the first electrode 1A, and a wavelength conversion unit 6 that includes nanocrystal phosphors.

The first electrode 1A is electrically connected to the light emitting element 4 through the wire 5. The first and second electrodes 1A and 1B need to be each composed of an electrically conductive material that functions as an electrical conduction path for establishing an electrical connection with the light emitting element 4. For example, a metallized layer containing powder of a metal such as W, Mo, Cu, or Ag is used as the conductive material. The substrate 2 is preferably composed of a material having high thermal conductivity and high total reflectance. For example, a ceramic material such as alumina or aluminum nitride or a polymer resin containing metal oxide fine particles dispersed therein can be suitably used.

The package 3 is composed of, for example, polyphthalamide having high reflectance and high adhesion to a sealing resin. The light emitting element 4 is used as a light source. Examples of the light emitting element 4 include GaN-based light emitting diodes, ZnO-based light emitting diodes, and diamond-based light emitting diodes each having a peak wavelength of 450 nm.

The wavelength conversion unit 6 includes a first phosphor 61, a second phosphor 62, and a resin 63 in which the first and second phosphors 61 and 62 is kneaded.

The first phosphor 61 emits, as secondary light, light having a wavelength shorter than that of light emitted from the second phosphor 62. For example, a rare-earth activated phosphor or a transition metal element activated phosphor can be used as the first phosphor 61. The phosphor does not readily undergo a decrease in emission efficiency even in the presence of oxygen or moisture. An example of the phosphor is a YAG:Ce phosphor obtained by introducing cerium (Ce) serving as an activator into yttrium-aluminum-garnet (YAG) serving as a base of the phosphor.

The phosphor is desirably a nitride phosphor activated with a rare-earth element or a transition metal element. A nitride phosphor is a phosphor whose emission efficiency is not easily decreased even at a high temperature. An example of the nitride phosphor is a SiAlON phosphor, specifically, a phosphor obtained by activating β-SiAlON with a rare-earth element or a transition metal element. A phosphor obtained by activating β-SiAlON with Tb, Yb, or Ag emits green light having a wavelength of 525 to 545 nm.

A green phosphor obtained by activating β-SiAlON with $Eu^{2+}$ can also be used. The Eu-activated β-SiAlON phosphor can be produced by a publicly known method. Specifically, the phosphor can be produced by homogeneously mixing an aluminum nitride (AlN) powder, a silicon nitride ($Si_3N_4$) powder, and a metal compound containing an optically active element Eu, such as $Eu_2O_3$ or EuN, with each other and sintering the mixture at a temperature of about 1800 to 2000° C. The mixing ratio of the raw material powders is suitably selected in consideration of the composition ratio of a phosphor obtained by the sintering.

Furthermore, an InP-based semiconductor nanocrystal phosphor may be used as the first phosphor 61. In an InP-based semiconductor, a quantum effect is produced by decreasing the crystal grain size (formation of nanocrystal), and thus the band gap can be controlled to be in a wavelength range of blue light to red light. For example, a cured resin piece prepared by curing a mixture of a silicone resin and InP-based semiconductor nanocrystals having a grain size that is suitable for emission of green light can be used as the first phosphor 61.

Alternatively, the first phosphor 61 may be a green phosphor containing nanocrystals composed of a group III-V compound semiconductor other than InP or a group II-VI compound semiconductor. Examples of a binary group II-VI compound semiconductor include CdS, CdSe, CdTe, ZnS, ZnSe, ZnTe, HgS, HgSe, HgTe, PbSe, and PbS. Examples of a binary group III-V compound semiconductor include GaN, GaP, GaAs, AlN, AlP, AlAs, InN, InP, and InAs.

Examples of a ternary or quaternary compound semiconductor include CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaNP, GaNAs, GaPAs, AlNP, AlNAs, AlPAs, InNP, InNAs, InPAs, InGaN, GaAlNP, GaAlNAs, GaAlPAs, GaInNP, GaInNAs, GaInPAs, InAlNP, InAlNAs, and InAlPAs.

When a semiconductor nanocrystal phosphor is used as the first phosphor 61, nanocrystals containing In and P or nanocrystals containing Cd and Se are preferably employed. This is because nanocrystals having a grain size that is suitable for emission of light having a wavelength shorter than that of light emitted from the second phosphor 62 described below can be easily produced from nanocrystals containing In and P or nanocrystals containing Cd and Se.

InP or CdSe is particularly preferably used. Nanocrystals composed of InP or CdSe are easily produced because such nanocrystals are composed of fewer materials. In addition, InP and CdSe are materials that exhibit high quantum yield, and thus nanocrystals composed of InP or CdSe exhibit high emission efficiency when irradiated with light from LEDs.

The second phosphor 62 includes a nanocrystal phosphor 621 and a surface film 622 that covers the nanocrystal phosphor 621. In general, since nanocrystal phosphors have a small size, the specific surface area is large. As a result, defects on a surface cause non-radiative transition, which may decrease the emission efficiency. By employing a core/shell structure, the defects are protected by the shell and thus the emission efficiency is significantly improved. The core/shell structure is a structure in which the surface of each of nanocrystals is covered with a film that has a thickness of several nanometers and is composed of a substance such as zinc sulfide having a band gap larger than that of the nanocrystal. By further improving the protective effect using an organic surfactant on the outer side of the film, sufficient emission efficiency can be achieved.

In this embodiment, for example, InP-based semiconductor nanocrystals are used for the nanocrystal phosphor 621 that emits secondary light having a wavelength longer than that of light emitted from the first phosphor 61. In an InP-based semiconductor, a quantum effect is produced by decreasing the crystal grain size (formation of nanocrystal), and thus the band gap can be controlled to be in a wavelength range of blue light to red light. A cured resin or glass piece prepared by curing a mixture of a silicone resin or glass and InP-based nanocrystals that are protected with a core/shell structure and have a grain size suitable for emission of red light can be used as the nanocrystal phosphor 621.

The nanocrystal phosphor 621 may be a red phosphor containing nanocrystals composed of a group III-V compound semiconductor other than InP or a group II-VI compound semiconductor. Examples of a binary group II-VI compound semiconductor include CdS, CdSe, CdTe, ZnS, ZnSe, ZnTe, HgS, HgSe, HgTe, PbSe, and PbS. Examples of a binary group III-V compound semiconductor include GaN, GaP, GaAs, AlN, AlP, AlAs, InN, InP, and InAs.

Examples of a ternary or quaternary compound semiconductor include CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaNP, GaNAs, GaPAs, AlNP, AlNAs, AlPAs, InNP, InNAs, InPAs, InGaN, GaAlNP, GaAlNAs, GaAlPAs, GaInNP, GaInNAs, GaInPAs, InAlNP, InAlNAs, and InAlPAs.

Nanocrystals containing In and P or nanocrystals containing Cd and Se are preferably used for the nanocrystal phosphor 621. This is because nanocrystals having a grain size that is suitable for emission of light in a wavelength range of 380 to 780 nm can be easily produced from such nanocrystals.

InP or CdSe is particularly preferably used. Nanocrystals composed of InP or CdSe are easily produced because such nanocrystals are composed of fewer materials. In addition, InP and CdSe are materials that exhibit high quantum yield, and thus nanocrystals composed of InP or CdSe exhibit high emission efficiency when irradiated with light from LEDs.

Phosphors other than the above-described nanocrystal phosphors may also be used as the second phosphor 62 as long as they emit secondary light having a wavelength longer than that of light emitted from the first phosphor 61. Among them, a nanocrystal phosphor is particularly useful because a nanocrystal phosphor absorbs light having any wavelength shorter than its emission wavelength.

The surface film 622 is a dielectric multilayer film. The dielectric multilayer film is suitably designed so as to transmit primary light emitted from the light emitting element 4, reflect secondary light emitted from the first phosphor 61, and transmit secondary light emitted from the nanocrystal phosphor 621. The surface film 622 is suitably composed of a material that reflects visible light. Examples of the material include $Al_2O_3$, $CaF_2$, $MgF_2$, $SiO_2$, ZnS, $ZrO_2$, $TiO_2$, and ZnO. Among them, $Al_2O_3$ and $SiO_2$ are particularly preferred in terms of ease of handling.

The surface film 622 is formed by any method in which a film can be suitably formed using a material that can transmit primary light emitted from the light emitting element 4 and secondary light emitted from the nanocrystal phosphor 621 and a material that can reflect secondary light emitted from the first phosphor 61. For example, the surface film 622 can be formed by alternately stacking materials having different dielectric constants by a liquid reaction method, a sol-gel method, a sputtering method, a spray-drying method, a mechanofusion method, or an atomic layer deposition (ALD)

method. Among these methods, the ALD method is the most preferred because a film can be uniformly formed on a spherical object.

When the ALD method is employed, a surface film can be formed by alternately stacking films composed of $Al_2O_3$ and $SiO_2$ used as materials of the surface film. When a stacked layer including an $Al_2O_3$ film and a $SiO_2$ film is assumed to be one set, 5 to 25 sets of stacked layers are preferably formed. That is, the alternate stacking is preferably performed 5 to 25 times and more preferably 10 to 20 times. When the alternate stacking is performed 5 times, about 80% of light emitted from the first phosphor 61 can be reflected. When the alternate stacking is performed 10 times, about 95% of light emitted from the first phosphor 61 can be reflected. If the alternate stacking is performed less than 5 times, light is not sufficiently reflected. If the alternate stacking is performed more than 25 times, light of various wavelengths coming from various directions may be excessively absorbed. The thickness of each of the films may be suitably set in accordance with the dielectric constant required.

EXAMPLES

Example

In Example, the light emitting device 10 was produced and the emission spectrum was measured. Herein, a blue light emitting element that emits light having a center wavelength of 450 nm was used as the light emitting element 4, and an electric current of 20 mA was applied thereto. An Eu-activated β-SiAlON phosphor that emits light having a center wavelength of 538 nm was used as the first phosphor 61. The second phosphor 62 included InP semiconductor nanocrystals that emit light having a center wavelength of 630 nm and a surface film 622 formed by an ALD method by stacking ten sets of layers, each set including an $Al_2O_3$ film having a dielectric constant of 9.0 and a thickness of 200 nm and a $SiO_2$ film having a dielectric constant of 3.8 and a thickness of 50 nm.

The InP semiconductor nanocrystals were placed in a vacuum reactor. By introducing trimethylaluminum and water vapor into the reactor, an $Al_2O_3$ film was formed. The thickness of the $Al_2O_3$ film formed through a single introduction of the gases was 0.11 nm. Subsequently, by introducing tetraethoxysilane and water vapor into the reactor, a $SiO_2$ film was formed. The thickness of the $SiO_2$ film formed through a single introduction of the gases was 0.10 nm. Satisfactory films were obtained by heating the sample at 200° C. during the film formation process. After the stacking process was performed a desired number of times, annealing was performed in an oxygen atmosphere at 200° C. for 15 minutes to remove excess raw materials. Since the surface film 622 having this composition can reflect only light having a wavelength of about 520 nm, the surface film 622 can reflect light emitted from the first phosphor 61.

The first phosphor 61 and the second phosphor 62 were sealed in the resin 63 to produce the light emitting device 10. The mixing ratio of the resin 63, the first phosphor 61, and the second phosphor 62 was 1000:83.5:3.37 by weight. The amount of the InP semiconductor nanocrystals was adjusted so that the chromaticity point was X=0.33 and Y=0.34 (chromaticity point A shown in FIG. 5), which is the chromaticity point of blackbody radiation at 5500 K which is the color temperature of typical rays of sunlight. SCR 1011 (viscosity before curing: 350 mPa·s) manufactured by Shin-Etsu Chemical Co., Ltd. was used as the resin 63.

Figure 2:
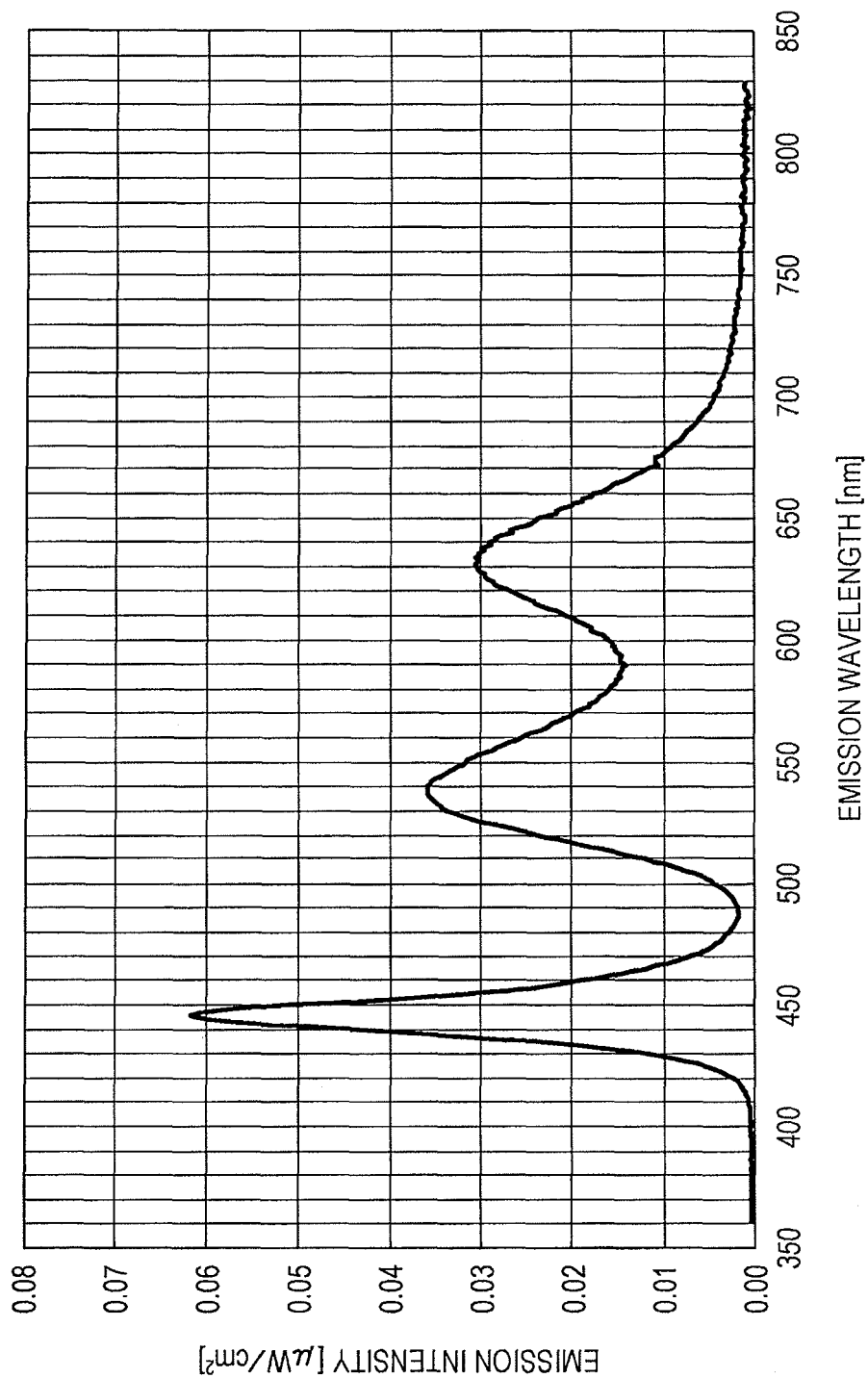
FIG. 2 shows a measurement result of an emission spectrum of the light emitting device according to an embodiment of the present invention.

FIG. 2 shows a measurement result of an emission spectrum obtained when an electric current of 20 mA was applied to the light emitting element 4. In FIG. 2, the vertical axis indicates emission intensity and the horizontal axis indicates emission wavelength. Since the surface film 622 of the second phosphor 62 reflects light having a wavelength of 500 to 580 nm, secondary light emitted from the first phosphor 61 is not absorbed. The total luminous flux obtained in the measurement was 1.63 lm. By covering the nanocrystal phosphor 621 with the surface film 622 that reflects only secondary light emitted from the first phosphor 61, only excitation light emitted from the light emitting element 4 can be transmitted to the nanocrystal phosphor 621 in the second phosphor 62 to cause excitation. In this case, secondary light emitted from the nanocrystal phosphor 621 can be transmitted through the surface film 622. Therefore, when a phosphor emits light having a longer wavelength, the light can be extracted without being affected by other phosphors.

Comparative Example 1

Figure 3:
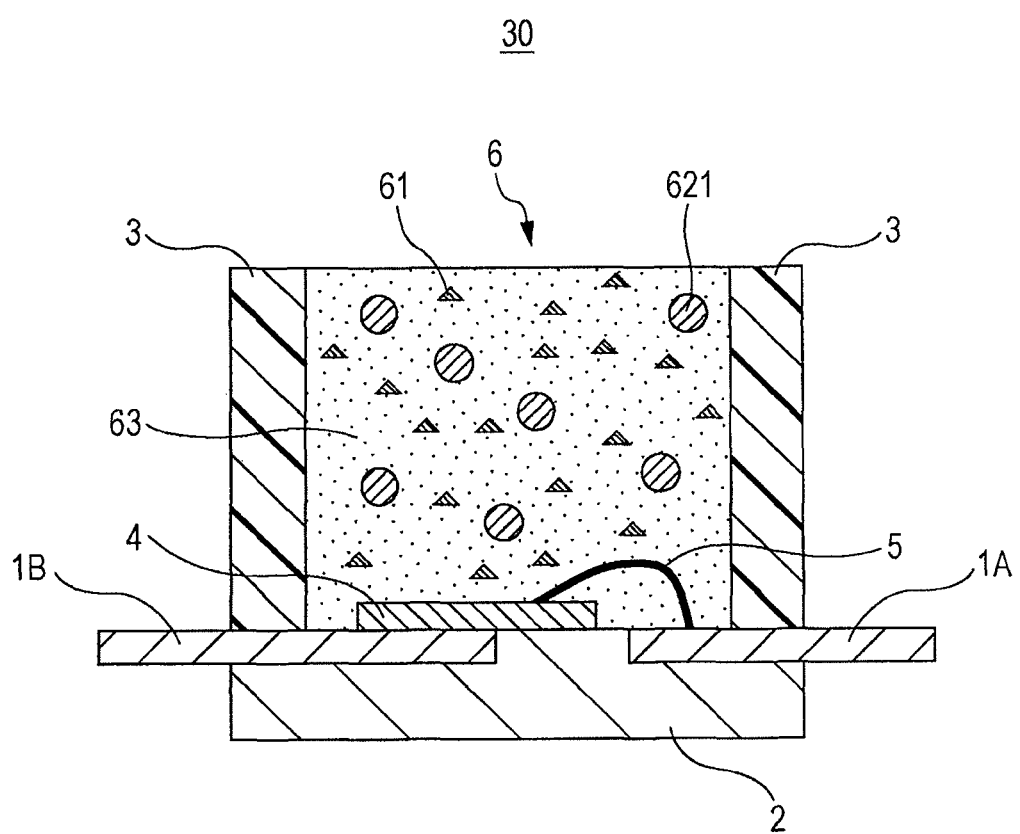
FIG. 3 is a sectional view of a light emitting device according to Comparative Example 1.

In Comparative Example 1, a light emitting device 30 shown in FIG. 3 was produced and the emission spectrum was measured. In the light emitting device 30, a second phosphor included a nanocrystal phosphor 621, but not a surface film 622. InP semiconductor nanocrystals having a center emission wavelength of 630 nm were used for the nanocrystal phosphor 621. The other conditions such as conditions concerning the light emitting element 4, the mixing ratio of the first phosphor 61 and the nanocrystal phosphor 621, and the conditions concerning the resin 63 were the same as those in Example.

Figure 4:
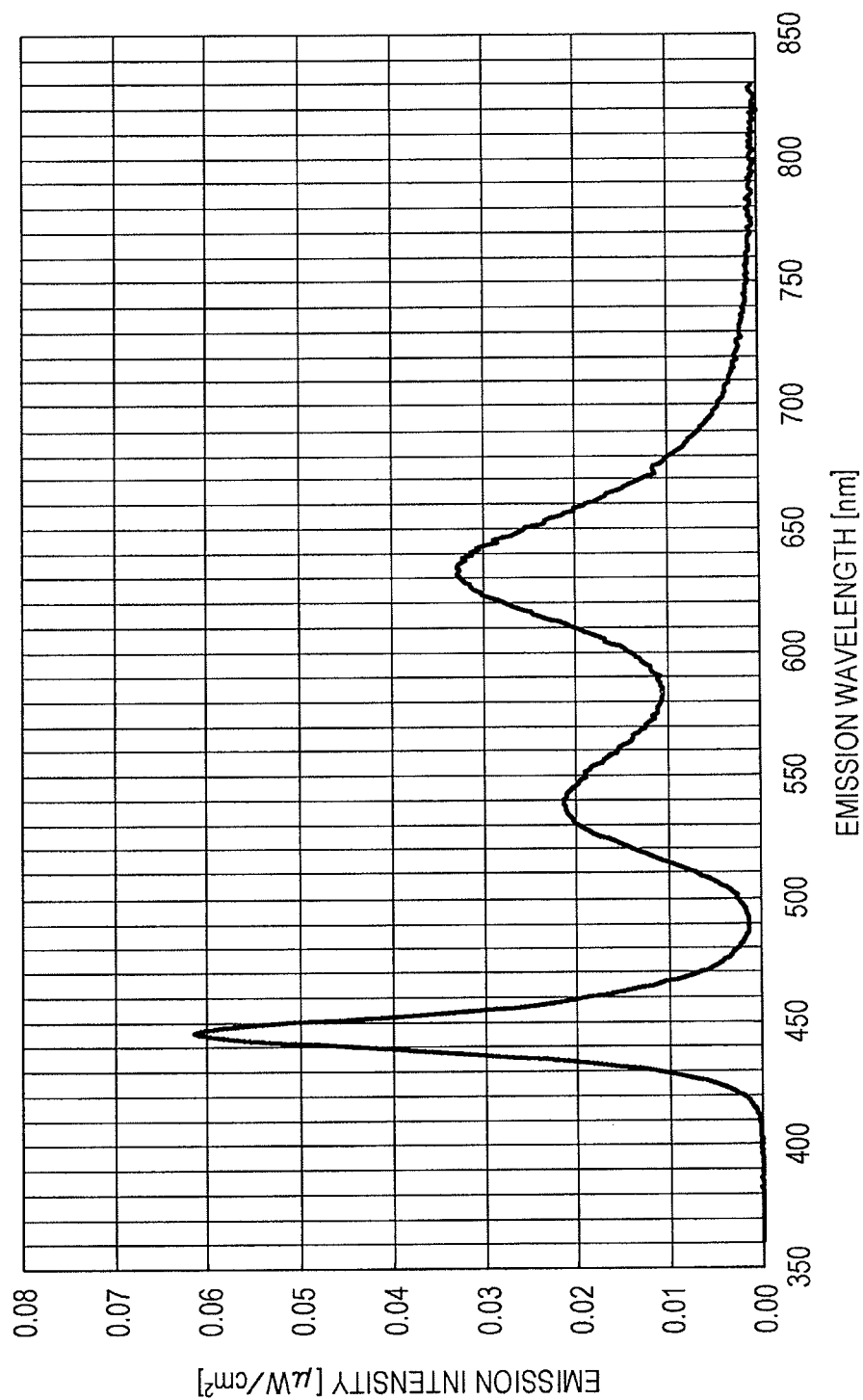
FIG. 4 shows a measurement result of an emission spectrum of the light emitting device according to Comparative Example 1.
Figure 5:
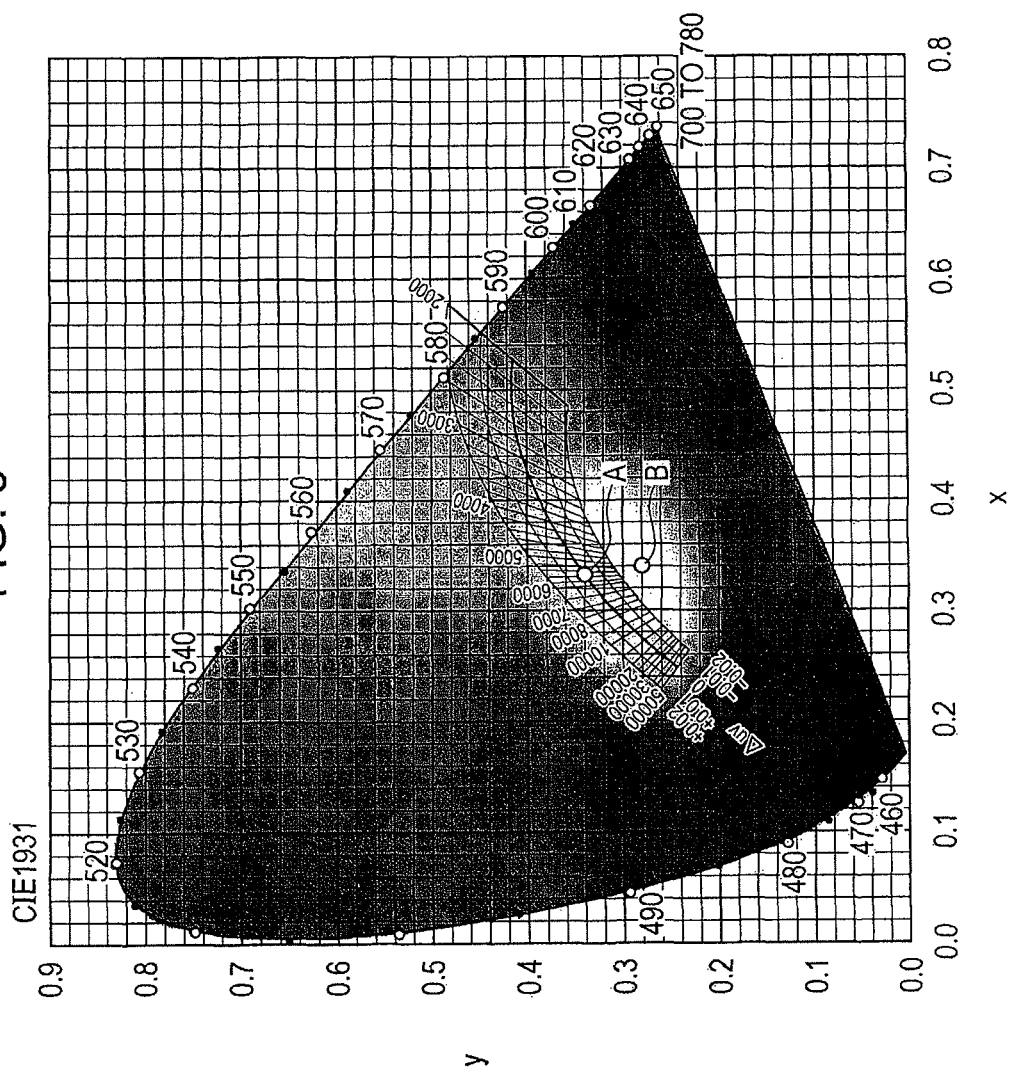
FIG. 5 shows measurement results of chromaticity points of the light emitting devices according to Example and Comparative Example 1.

FIG. 4 shows a measurement result of an emission spectrum obtained when an electric current of 20 mA was applied to the light emitting element 4. Compared with Example, the emission intensity of the first phosphor 61 having an emission wavelength of 538 nm was decreased, and the emission intensity of the nanocrystal phosphor 621 having an emission wavelength of 630 nm was increased. The chromaticity point was X=0.34 and Y=0.28 (chromaticity point B) as shown in FIG. 5. It was found from this result that the chromaticity point of the light emitting device 30 was significantly shifted from the ideal chromaticity point A set in Example and the color balance was disturbed. These phenomena may have occurred because the nanocrystal phosphor 621 absorbed secondary light emitted from the first phosphor 61.

Comparative Example 2

Figure 6:
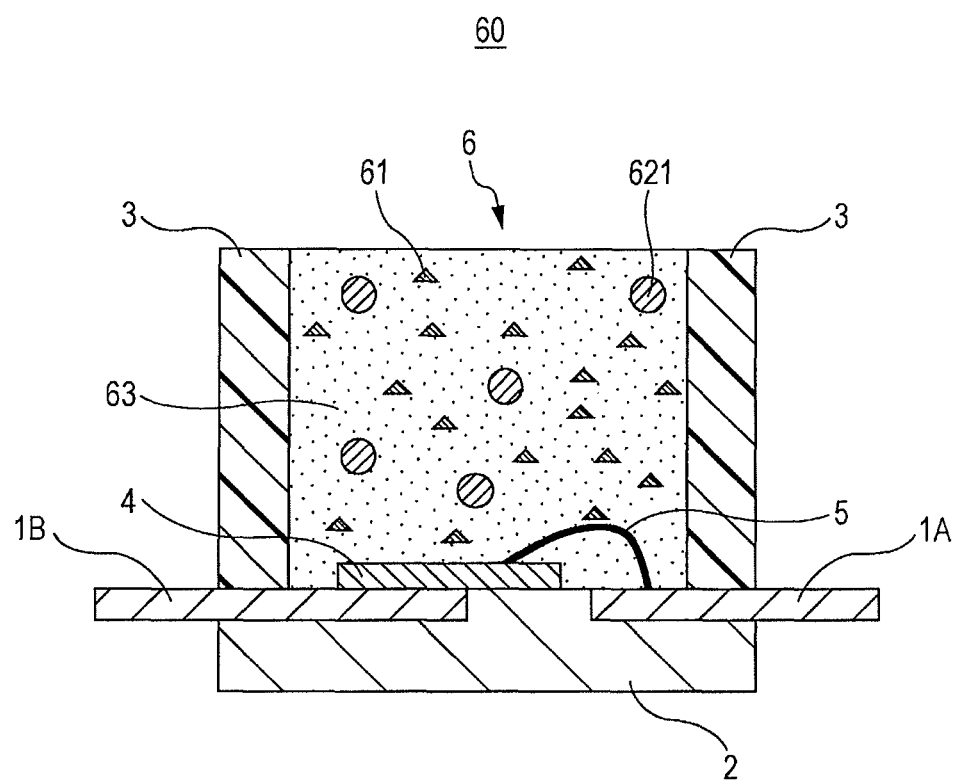
FIG. 6 is a sectional view of a light emitting device according to Comparative Example 2.

In Comparative Example 2, a light emitting device 60 shown in FIG. 6 was produced and the emission spectrum was measured. In the light emitting device 60, InP semiconductor nanocrystals having a center emission wavelength of 630 nm were used for the nanocrystal phosphor 621 without forming a surface film, and the amount of the InP semiconductor nanocrystals was adjusted so that the chromaticity point was X=0.33 and Y=0.34, which is the chromaticity point of blackbody radiation at 5500 K which is the color temperature of typical rays of sunlight. The other conditions such as conditions concerning the light emitting element 4 and the resin 63 were the same as those in Example. The first phosphor 61 and the nanocrystal phosphor 621 were sealed in the resin 63 to produce the light emitting device 60. The mixing ratio of the resin 63, the first phosphor 61, and the nanocrystal phosphor 621 was 1000:100:2.31 by weight. The InP semiconductor nanocrystal phosphor absorbs 40% of photons in secondary light emitted from the first phosphor 61 and emits, as secondary light, fluorescence having an intensity corresponding to 20% of the absorbed photons.

Figure 7:
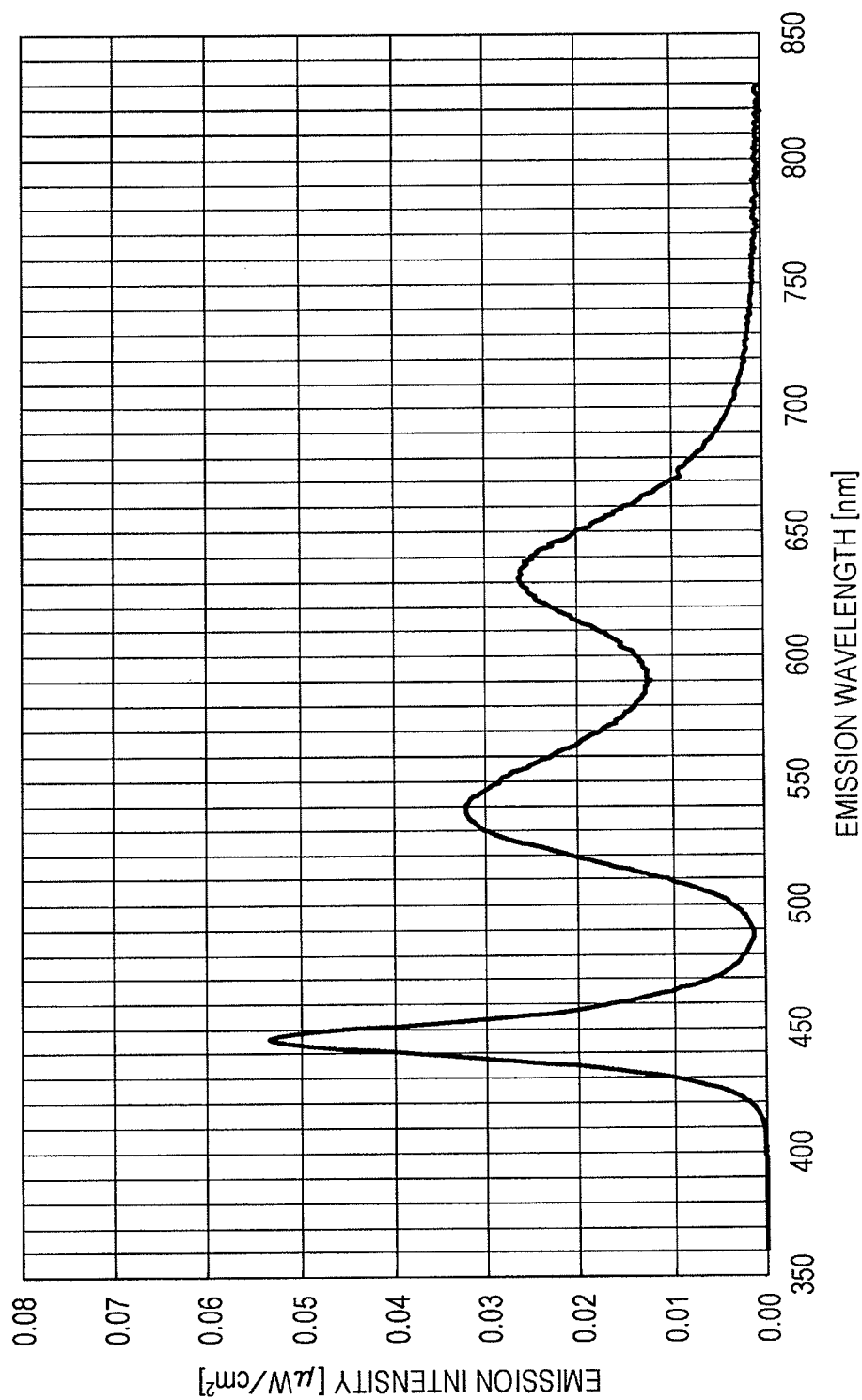
FIG. 7 shows a measurement result of an emission spectrum of the light emitting device according to Comparative Example 2.
Figure 8:
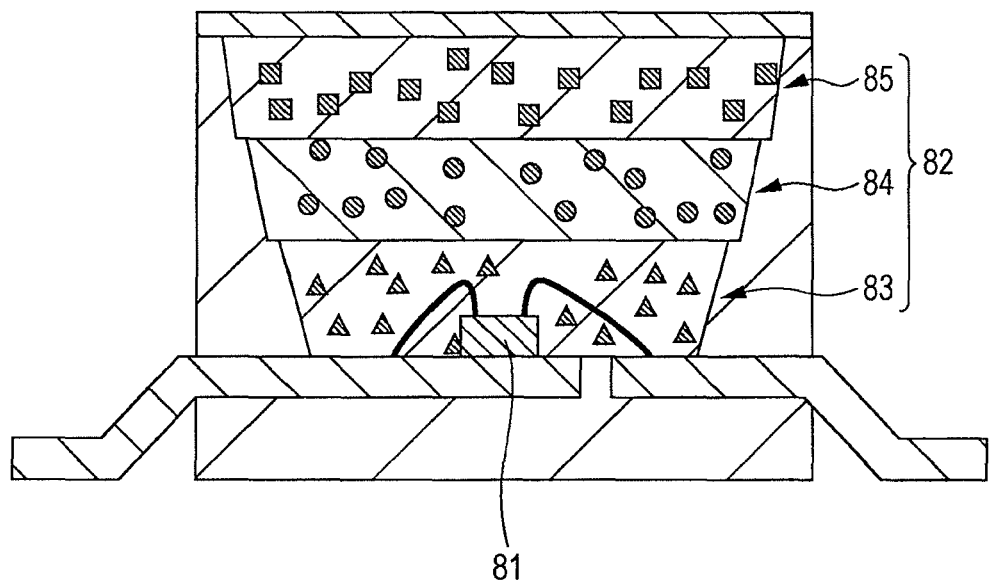
FIG. 8 is a schematic view of a typical light emitting device.

FIG. 7 shows a measurement result of an emission spectrum obtained when an electric current of 20 mA was applied to the light emitting element 4. In FIG. 7, the vertical axis indicates emission intensity and the horizontal axis indicates emission wavelength. The total luminous flux obtained in the measurement was 1.45 lm. The waveform and relative intensity of the spectrum were the same as those of Example, but the total luminous flux was lower than that of Example.

Furthermore, the emission efficiency in Example was 27.2 lm/W whereas the emission efficiency in Comparative Example 2 was 24.2 lm/W. This means that the emission efficiency in Example was higher than that in Comparative Example 2 by 12.4%. All the three peaks in FIG. 2 were higher than the corresponding three peaks in FIG. 7. This is because, by covering the nanocrystal phosphor 621 with the surface film 622, secondary light emitted from the first phosphor 61 was prevented from being absorbed by the second phosphor 62. It was found that light could be efficiently extracted using such a structure. The content of the first phosphor 61 and the content of the second phosphor 62 may be each set in accordance with, for example, the required color rendering properties of light emitted from a light emitting device.

According to the present invention, the second phosphor 62 has a structure in which the nanocrystal phosphor 621 is covered with the surface film 622. Therefore, the second phosphor 62 reflects secondary light emitted from the first phosphor 61 without absorbing it, and thus light can be efficiently extracted from the wavelength conversion unit 6. In addition, there is no need to stack the first phosphor and second phosphor that have been mixed in different resins in advance. A light emitting device can be produced through a simple process in which the first phosphor and second phosphor are mixed and kneaded in a resin.

As described above, the wavelength conversion unit is constituted by the first phosphor and the second phosphor obtained by covering a surface of the nanocrystal with a dielectric multilayer film, whereby a high luminance, high color reproducibility light emitting device whose emission color can be adjusted and set and which can suppress mutual absorption of light by different phosphors can be produced through a simple process.

A light emitting device according to an embodiment of the present invention can be suitably used for light emitting devices including a semiconductor light emitting element which emits primary light and a wavelength conversion unit that includes a phosphor which absorbs the primary light and emits secondary light.

What is claimed is:

1. A light emitting device comprising:
   a light emitting element that emits primary light; and
   a wavelength conversion unit that absorbs part of the primary light and emits secondary light,
   wherein the wavelength conversion unit includes a plurality of types of phosphors that emit secondary light having wavelengths different from each other, and
   at least one of the phosphors is a covered phosphor covered with a surface film that reflects secondary light emitted from a phosphor other than the covered phosphor.

2. The light emitting device according to claim 1, wherein the surface film is a film formed through alternate stacking of layers of two compounds having different dielectric constants.

3. The light emitting device according to claim 2, wherein at least one of the compounds is aluminum oxide or silicon oxide.

4. The light emitting device according to claim 2, wherein the surface film is a film formed by repeatedly performing the alternate stacking 5 times or more and 25 times or less.

5. The light emitting device according to claim 2, wherein the surface film is a film formed by repeatedly performing the alternate stacking 10 times or more and 20 times or less.

6. The light emitting device according to claim 1, wherein the covered phosphor emits secondary light having a wavelength longer than that of secondary light emitted from the phosphor other than the covered phosphor.

7. The light emitting device according to claim 1, wherein at least one of the plurality of types of phosphors is a nanocrystal phosphor.

8. The light emitting device according to claim 7, wherein the nanocrystal phosphor is composed of a group III-V compound semiconductor or a group II-VI compound semiconductor.

9. The light emitting device according to claim 8, wherein the nanocrystal phosphor contains at least one of InP and CdSe.

10. The light emitting device according to claim 1, wherein at least one of the plurality of types of phosphors is a rare-earth activated phosphor.

11. The light emitting device according to claim 10, wherein the rare-earth activated phosphor contains cerium or europium as an activator.

12. The light emitting device according to claim 10, wherein the rare-earth activated phosphor is a nitride phosphor.

13. The light emitting device according to claim 12, wherein the nitride phosphor is a SiAlON phosphor.

14. A method for producing a light emitting device including a light emitting element that emits primary light and a wavelength conversion unit that absorbs part of the primary light and emits secondary light, the method comprising:
   a step of forming the wavelength conversion unit using a plurality of types of phosphors that emit secondary light having wavelengths different from each other,
   wherein at least one of the phosphors is a covered phosphor covered with a surface film that reflects secondary light emitted from a phosphor other than the covered phosphor.

* * * * *